(12) United States Patent
Salhuana et al.

(10) Patent No.: US 11,029,659 B2
(45) Date of Patent: Jun. 8, 2021

(54) METHOD AND APPARATUS FOR REMOTE FIELD PROGRAMMABLE GATE ARRAY PROCESSING

(71) Applicant: Intel Corporation, Santa Clara, CA (US)

(72) Inventors: Nicolas A. Salhuana, Tempe, AZ (US); Karthik Kumar, Chandler, AZ (US); Thomas Willhalm, Sandhausen (DE); Francesc Guim Bernat, Barcelona (ES); Narayan Ranganathan, Bangalore (IN)

(73) Assignee: Intel Corporation, Santa Clara, CA (US)

( * ) Notice: Subject to any disclaimer, the term of this patent is extended or adjusted under 35 U.S.C. 154(b) by 81 days.

(21) Appl. No.: 16/314,401

(22) PCT Filed: Jun. 30, 2016

(86) PCT No.: PCT/US2016/040340
§ 371 (c)(1),
(2) Date: Dec. 29, 2018

(87) PCT Pub. No.: WO2018/004590
PCT Pub. Date: Jan. 4, 2018

(65) Prior Publication Data
US 2019/0155239 A1    May 23, 2019

(51) Int. Cl.
*G06F 13/38* (2006.01)
*G05B 19/042* (2006.01)
*H03K 19/17732* (2020.01)
*G06F 8/41* (2018.01)
*H03K 19/17728* (2020.01)

(52) U.S. Cl.
CPC .......... *G05B 19/0426* (2013.01); *G06F 8/44* (2013.01); *G06F 8/456* (2013.01); *H03K 19/17728* (2013.01); *H03K 19/17732* (2013.01); *G05B 2219/21109* (2013.01)

(58) Field of Classification Search
CPC ...................................................... G06F 13/10
See application file for complete search history.

(56) References Cited

U.S. PATENT DOCUMENTS

| 7,584,345 | B2 | 9/2009 | Doering et al. |
| 10,459,773 | B2* | 10/2019 | Okada ..................... G06F 9/526 |
| 2005/0278502 | A1 | 12/2005 | Hundley |
| 2010/0153686 | A1 | 6/2010 | Frank |
| 2015/0347107 | A1 | 12/2015 | Munshi et al. |
| 2016/0004693 | A1 | 1/2016 | Chen et al. |
| 2016/0098356 | A1 | 4/2016 | Shiu |
| 2016/0335120 | A1* | 11/2016 | Gupta ..................... G06F 9/547 |

OTHER PUBLICATIONS

International Search Report and Written Opinion issued in PCT Application No. PCT/US2016/40340 dated Nov. 3, 2016; 10 pages.

* cited by examiner

*Primary Examiner* — Cheng Yuan Tseng
(74) *Attorney, Agent, or Firm* — Patent Capital Group

(57) ABSTRACT

In one embodiment, an apparatus comprises a fabric controller of a first computing node. The fabric controller is to receive, from a second computing node via a network fabric that couples the first computing node to the second computing node, a request to execute a kernel on a field-programmable gate array (FPGA) of the first computing node; instruct the FPGA to execute the kernel; and send a result of the execution of the kernel to the second computing node via the network fabric.

20 Claims, 7 Drawing Sheets

METHOD AND APPARATUS FOR REMOTE FIELD PROGRAMMABLE GATE ARRAY PROCESSING

This Application is a national stage application under 35 U.S.C. § 371 of PCT Application PCT/US2016/040340, filed Jun. 30, 2016 and entitled "METHOD AND APPARATUS FOR REMOTE FIELD PROGRAMMABLE GATE ARRAY PROCESSING", which is hereby incorporated by reference in their entirety.

FIELD

The present disclosure relates in general to the field of computer development, and more specifically, to remote field programmable gate array (FPGA) processing.

BACKGROUND

A computing node may include one or more processors, one or more memory devices, and one or more FPGAs. A computing node may also be coupled to one or more other computing nodes via a network fabric. In various embodiments, a core of a processor may offload a computing request to an FPGA.

BRIEF DESCRIPTION OF THE DRAWINGS

Like reference numbers and designations in the various drawings indicate like elements.

DETAILED DESCRIPTION

Although the drawings depict particular computer systems, the concepts of various embodiments are applicable to any suitable integrated circuits and other logic devices. Examples of devices in which teachings of the present disclosure may be used include desktop computer systems, server computer systems, mainframe computer systems, storage systems, handheld devices, tablets, other thin notebooks, systems on a chip (SOC) devices, and embedded applications. Some examples of handheld devices include cellular phones, Internet protocol devices, digital cameras, personal digital assistants (PDAs), and handheld PCs. Embedded applications may include a microcontroller, a digital signal processor (DSP), a system on a chip, network computers (NetPC), set-top boxes, network hubs, wide area network (WAN) switches, or any other system that can perform the functions and operations taught below.

Figure 1:
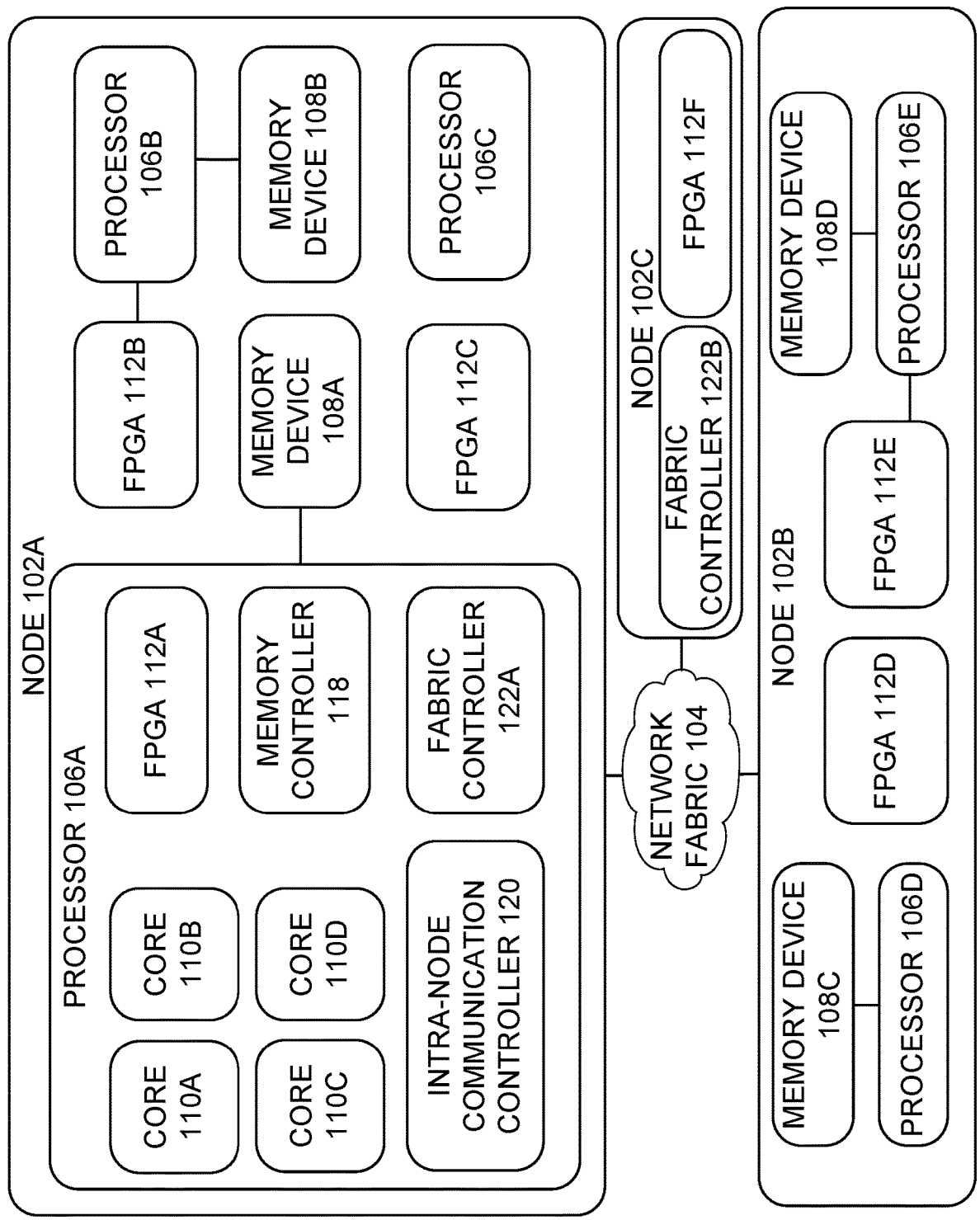
FIG. 1 illustrates a block diagram of components of a computer system in accordance with certain embodiments.

FIG. 1 illustrates a block diagram of components of a computer system 100 in accordance with certain embodiments. System 100 may include any suitable number of computing nodes 102 coupled to each other via a network fabric 104. A node 102 may include any suitable number of processors 106, memory devices 108, FPGAs 112, controllers (e.g., 118, 120, or 122), and/or other components. System 100 may represent any suitable computing environment, such as a high performance computing environment, a datacenter, a communications service provider infrastructure (e.g., one or more portions of an Evolved Packet Core), an in-memory computing environment, other computing environment, or combination thereof.

In particular computing environments, low-latency data processing is very important. For example, various solutions may involve obtaining data from sensors or end points and sending the data to a set of servers for analysis. In response to the analysis, a decision is made and executed. Low-latency data processing is important in a wide variety of applications, including autonomous cars, fraud detection, national security applications, and financial trading, to name a few. To achieve high bandwidth and low latency, data may be transferred to and from computing elements as quickly as possible and data may be processed as quickly as possible. In various embodiments, FPGAs may promote low-latency data processing by accelerating specialized applications having data parallelism.

In various systems, FPGAs on various different computing nodes may be programmed by a central entity or other logic. When an FPGA on a computing node is programmed (or reprogrammed), the central entity or other logic may transfer the bit stream (that configures the FPGA to perform the desired algorithm) to a processor (e.g., CPU) of the computing node, and the processor will program the FPGA. However, programming the FPGA through the processor increases the latency.

In various embodiments, at least some of the computing nodes 102 in a computer system 100 include one or more FPGAs. In various embodiments, a component (e.g., a core 110 or a processor 106) of a particular computing node (e.g., 102A) may utilize an FPGA on a remote computing node (e.g., computing node 102B or 102C). Herein, with respect to a particular computing node (or a component thereof), a remote FPGA may refer to an FPGA located on a different computing node. As one example, FPGAs 112D-F are remote FPGAs with respect to computing node 102A and its components, while FPGAs 112A-C are local FPGAs with respect to computing node 102A and its components. As an example of a computing node utilizing a remote FPGA, when a computing node consumes all of its FPGA resources, it may further accelerate its processing by using another computing node's FPGA. In other embodiments, a computing node may not include an FPGA (or may not include an FPGA suitable for a particular task) and may request FPGA resources from a different computing node.

The computing nodes 102 may be coupled together via a network fabric (which may be a low latency interconnect fabric). In order to communicate over the network fabric, a computing node may comprise one or more fabric controllers 122. In particular embodiments, the fabric controllers 122 of a computing node are capable of programming an FPGA of a computing node 102 directly (e.g., without utilizing a processor 106 of the computing node 102 to program the FPGA). In various embodiments, the fabric controllers 122 may also be capable of directing FPGAs to execute algorithms (referred to herein as kernels) programmed on the FPGAs without interacting with a processor 106 of the computing node. In particular embodiments, the fabric controllers 122 may also be capable of directly interacting with FPGAs to determine the programming state (e.g., which kernels are programmed and/or being run on the FPGAs).

Various embodiments may offer particular technical advantages such as reducing the latency involved in an FPGA request sent to a remote computing node (e.g., by eliminating processor (i.e., CPU) intervention on the remote computing node). Other technical advantages may include allowing an FPGA to be treated as a pooled resource where computing nodes 102 participating in a scale-out architecture can access the FPGA over a network fabric. Other technical advantages may include allowing distributed solutions to orchestrate complex situations where one or more computing nodes registers (i.e., initiate the programming of) a set of kernels and the remaining computing nodes can run the kernels. Other technical advantages include allow a computing node to quickly discover which kernels are currently programmed and/or available to be programmed by each FPGA in the computer system 100. Other technical advantages may include allowing adaptive and intelligent decisions to be made regarding usage and pooling of FPGA resources (thus reducing the amount of FPGA reprogramming).

Computer system 100 may include any suitable number of computing nodes 102 implementing any number of memory coherent domains. In a memory coherent domain, a memory address space is consistently maintained among a plurality of cores 110, processors 106, or nodes 102. In a particular embodiment, each node 102 of system 100 implements a coherent domain. In other embodiments, a coherent domain may be formed by a set of nodes 102 sharing the same address space (which for a given node may include all or a portion of the node's address space). Using the network fabric 104, a computing node 102 may expose some or all of its address region to other nodes (that may be implementing their own coherent domains). In various embodiments, a computing node 102 may implement more than one coherent domain and any number of the coherent domains may be accessible by processors 106 of other computing nodes. In various embodiments, a computing node 102 may comprise one or more sockets that each comprise a processor. In a particular embodiment, a computing node 102 may comprise a circuit board comprising sockets for each processor 106 of the node.

Processor 106 may comprise any suitable processor, such as a microprocessor, an embedded processor, a digital signal processor (DSP), a network processor, a handheld processor, an application processor, a co-processor, a system on a chip (SOC), or other device to execute code (i.e., software instructions). Processor 106, in the depicted embodiment, includes four processing elements (e.g., cores 110A-110D), which may include asymmetric processing elements or symmetric processing elements. However, a processor may include any number of processing elements that may be symmetric or asymmetric.

In one embodiment, a processing element refers to hardware or logic to support a software thread. Examples of hardware processing elements include: a thread unit, a thread slot, a thread, a process unit, a context, a context unit, a logical processor, a hardware thread, a core, and/or any other element, which is capable of holding a state for a processor, such as an execution state or architectural state. In other words, a processing element, in one embodiment, refers to any hardware capable of being independently associated with code, such as a software thread, operating system, application, or other code. A physical processor (or processor socket) typically refers to an integrated circuit, which potentially includes any number of other processing elements, such as cores or hardware threads.

A core 110 may refer to logic located on an integrated circuit capable of maintaining an independent architectural state, wherein each independently maintained architectural state is associated with at least some dedicated execution resources. A hardware thread may refer to any logic located on an integrated circuit capable of maintaining an independent architectural state, wherein the independently maintained architectural states share access to execution resources. As can be seen, when certain resources are shared and others are dedicated to an architectural state, the line between the nomenclature of a hardware thread and core overlaps. Yet often, a core and a hardware thread are viewed by an operating system as individual logical processors, where the operating system is able to individually schedule operations on each logical processor.

In various embodiments, the processing elements may also include one or more arithmetic logic units (ALUs), floating point units (FPUs), caches, instruction pipelines, interrupt handling hardware, registers, or other hardware to facilitate the operations of the processing elements.

A computing node 102 may comprise any number of FPGAs 112. An FPGA may be a semiconductor device that may include configurable logic. An FPGA may be programmed via a data structure (e.g., a bitstream) having any suitable format that defines how the logic is to be configured. An FPGA may be reprogrammed any number of times after the FPGA is manufactured.

Configurable logic of an FPGA 112 may be programmed to implement one or more kernels. A kernel may comprise configured logic of the FPGA that may receive a set of one or more inputs, process the set of inputs using the configured logic, and provide a set of one or more outputs. The kernel may perform any suitable type of processing. In various embodiments, a kernel may comprise a video processor, an image processor, a waveform generator, a pattern recognition module, a packet processor, an encryptor, a decryptor, an encoder, a decoder, a processor operable to perform any number of operations each specified by a distinct instruction sequence, or other suitable processing function. Some FPGAs 112 may be limited to executing a single kernel at a time while other FPGAs may be capable of executing multiple kernels simultaneously. In various embodiments, an FPGA 112 may send a message to at least one fabric controller 122 coupled to the FPGA indicating how many kernels the FPGA 112 supports (e.g., how many kernels may be loaded onto the FPGA 112 and/or how many kernels the FPGA 112 may execute simultaneously).

Any suitable entity of a computing node 102 may program an FPGA 112 to implement one or more kernels and/or to execute the one or more kernels (i.e., to provide one or more input parameters to the FPGA and instruct the FPGA to perform the functions of the kernel based on the input parameters). For example, a core 110, an intra-node communication controller 120, or a fabric controller 122 may directly (or indirectly through another component) program an FPGA with a kernel or instruct the FPGA to execute a kernel. In particular embodiments, an FPGA 112 may be connected to a core directly (e.g., if the FPGA is integrated with the processor as shown by FPGA 112A) or through an intermediary such as an I/O controller (e.g., the FPGA may be connected to the processor through a PCI Express (PCIe) connection. In some embodiments, an FPGA may additionally or alternatively be connected directly (or through an intermediary) to at least one fabric controller 122 that is resident on the same computing node 102 as the FPGA.

A memory device 108 may store any suitable data, such as data used by processors 106 or FPGAs 112 to provide the functionality of computer system 100. For example, data associated with programs that are executed or files accessed by cores 110 may be stored in memory device 108. Thus, a memory device 108 may include a system memory that stores data and/or sequences of instructions that are used or executed by the cores 110. In various embodiments, a memory device 108 may store persistent data (e.g., a user's files or instruction sequences) that remains stored even after power to the memory device 108 is removed. A memory device 108 may be dedicated to a particular processor 106 or FPGA 112 or shared with other devices (e.g., one or more other processors or other device) of computer system 100.

In various embodiments, a memory device 108 may include a memory comprising any number of memory modules, a memory device controller, and other supporting logic. A memory module may include a plurality of memory cells that are each operable to store one or more bits. The cells of a memory module may be arranged in any suitable fashion, such as in columns and rows or three dimensional structures. The cells may be logically grouped into banks, blocks, pages (wherein a page is a subset of a block), subblocks, frames, wordlines, bit lines, bytes, or other suitable groups.

A memory module may include non-volatile memory and/or volatile memory. Non-volatile memory is a storage medium that does not require power to maintain the state of data stored by the medium. Nonlimiting examples of non-volatile memory may include any or a combination of: solid state memory (such as planar or 3D NAND flash memory or NOR flash memory), 3D crosspoint memory, memory devices that use chalcogenide phase change material (e.g., chalcogenide glass), byte addressable nonvolatile memory devices, ferroelectric memory, silicon-oxide-nitride-oxide-silicon (SONOS) memory, polymer memory (e.g., ferroelectric polymer memory), ferroelectric transistor random access memory (Fe-TRAM) ovonic memory, nanowire memory, electrically erasable programmable read-only memory (EEPROM), other various types of non-volatile random access memories (RAMs), and magnetic storage memory. In some embodiments, 3D crosspoint memory may comprise a transistor-less stackable cross point architecture in which memory cells sit at the intersection of words lines and bit lines and are individually addressable and in which bit storage is based on a change in bulk resistance. In particular embodiments, a memory module with non-volatile memory may comply with one or more standards promulgated by the Joint Electron Device Engineering Council (JEDEC), such as JESD218, JESD219, JESD220-1, JESD223B, JESD223-1, or other suitable standard (the JEDEC standards cited herein are available at www.jedec.org).

Volatile memory is a storage medium that requires power to maintain the state of data stored by the medium. Examples of volatile memory may include various types of random access memory (RAM), such as dynamic random access memory (DRAM) or static random access memory (SRAM). One particular type of DRAM that may be used in a memory module is synchronous dynamic random access memory (SDRAM). In particular embodiments, DRAM of the memory modules complies with a standard promulgated by JEDEC, such as JESD79F for Double Data Rate (DDR) SDRAM, JESD79-2F for DDR2 SDRAM, JESD79-3F for DDR3 SDRAM, or JESD79-4A for DDR4 SDRAM (these standards are available at www.jedec.org).

Memory device 108 may have any suitable form factor. In a particular embodiment, memory device 108 has a dual in-line memory module (DIMM) form factor. A DIMM may include multiple memory modules mounted on a circuit board that includes electrical contacts (i.e., pins) on each side of the circuit board. In various examples, the memory device 108 may have any suitable number of pins, such as 288, 260, 244, 240, 204, 200, or other suitable number of pins. In various embodiments, memory device 108 may be inserted into a DIMM slot on a circuit board (e.g., motherboard) that also comprises a socket for processor 106. In other embodiments, memory device 108 may have any other suitable form factor.

Memory devices 108 may comprise any suitable type of memory and are not limited to a particular speed or technology of memory in various embodiments. Memory devices 108 may include any suitable interface to communicate with a memory controller 118 or an I/O controller of a processor using any suitable communication protocol such as a DDR-based protocol, peripheral component interconnect (PCI), PCI Express (PCIe), Universal Serial Bus (USB), Serial Attached SCSI (SAS), Serial ATA (SATA), Fibre Channel (FC), System Management Bus (SMBus), or other suitable protocol. In particular embodiments, memory device 108 may comprise multiple communication interfaces that each communicate using a separate protocol with a memory controller 118 and/or I/O controller.

Memory controller 118 is an integrated memory controller (i.e., it is integrated on the same die or integrated circuit as processor 106A) that includes logic to control the flow of data going to and from the memory devices 108. Memory controller 118 may include logic operable to read from a memory device 108, write to a memory device 108, or to request other operations from a memory device 108. In various embodiments, memory controller 118 may receive write requests from cores 110 and may provide data specified in these requests to a memory device 108 for storage therein. Memory controller 118 may also read data from a memory device 108 and provide the read data to an I/O controller or a core 110. During operation, memory controller 118 may issue commands including one or more addresses of the memory device 108 in order to read data from or write data to memory (or to perform other operations). In some embodiments, memory controller 118 may be implemented in a different die or integrated circuit than that of processor 106A.

Intra-node communication controller 120 provides an interface for intra-node communication. Intra-node communication controller 120 may couple to an interconnect that provides a transportation path between two or more processors (or processor cores) and/or between a processor or core and an FPGA 112 that is local to the processor or core. In various embodiments, the interconnect may be a point-to-point processor interconnect, and the procotol used to communicate over the interconnect may have any suitable characteristics of Intel Ultra Path Interconnect (UPI), Intel QuickPath Interconnect (QPI), or other known or future intra-node communication protocol. In various embodiments, intra-node communication controller 120 may be a UPI agent, QPI agent, or similar agent capable of managing intra-node communications. In various embodiments, the same communication protocol used to communicate between processors 106 may be used for intra-processor communications, such as communications between a core 110 and an FPGA 112, a core 110 and a fabric controller 122, or between a fabric controller and an FPGA 112 integrated on a processor, or other intra-node communications, such as between a fabric controller 122 (that may or may not be integrated on a processor) and an FPGA that is not integrated on the processor (such as FPGA 112B or 112C).

Fabric controller 122 provides an interface for inter-node communication. In particular embodiments, the fabric controller 122 may function as a proxy and make a remote node (e.g., 102B) appear to a processor (e.g., 106A) like a processor on the same node. Fabric controller 122 may bridge between a communication protocol used by a processor 106 and a communication protocol used by the network fabric 104. In particular embodiments, this may include implementing the physical and link layers of the fabric architecture, such that a node can attach to the network fabric and send packets to and receive packets from other nodes. In various embodiments, fabric controller 122 may include specialized logic for executing or accelerating upper layer protocols. In particular embodiments, a fabric controller may also respond to messages from network management components.

In a particular embodiment, fabric controller 122A may receive requests for remote FPGAs and send associated requests over the network fabric 104 to fabric controllers (e.g., 122B) of the remote nodes. The fabric controller 122A may also receive, over the network fabric, data provided in response to such requests, and provide the results to the requesting entity (e.g., a core 110). In some embodiments, this may involve storing the results in a memory device 108 for retrieval by the requesting entity. In a particular embodiment, requests communicated across the network fabric 104 by the fabric controllers 122 are transport layer requests (e.g., requests according to Layer 4 of the Open Systems Interconnection model).

In various embodiments, fabric controller 122 may include logic to communicate using any suitable physical layer and data link layer standard such as Ethernet (e.g., as defined by an IEEE 802.3 standard), Fibre Channel, InfiniBand, Intel Omni-Path Host Fabric Interface (HFI), or other suitable standard. Fabric controller 122 may include or be coupled to one or more physical ports that may couple to a cable (e.g., an Ethernet cable, Infiniband cable, QSFP28 cable, or other suitable cable).

In various embodiments, fabric controller 122 may comprise a host bus adapter (e.g., an InfiniBand host channel adapter), a network interface controller (e.g., an Ethernet controller), an HFI adapter, or other suitable controller operable to manage communication between a processor 106 and network fabric 104.

In various embodiments, fabric controller 122 may be integrated on the same die or integrated circuit as processor 106. In other embodiments, fabric controller 122 may be located off of the die (e.g., on a chip or card insertable into a socket or slot of node 102). In various embodiments, a fabric controller 122 may be dedicated to a single processor 106 or shared among multiple processors 106 of the same node 102. In a particular embodiment, the fabric controller 122 may interface directly with other components of processor 106. In another embodiment, the fabric controller 122 may interface with components of processor 106 through an I/O controller, such as that described below.

Network fabric 104 may be any suitable network operating using one or more suitable networking protocols. Network fabric 104 may represent a series of interconnected communication paths for receiving and transmitting packets of information. In various embodiments, network fabric 104 may be a switched fabric which connects any number of fabric controllers 122 of various nodes 102 via one or more network switches (e.g., crossbar switches). In various embodiments, network fabric 104 may provide point-to-point connectivity between the fabric controllers 122. In particular embodiments, network fabric 104 is physically co-located with computing nodes 102. For example, the computing nodes 102 and network fabric 104 may be located in the same rack or chassis, or within the same physical building.

Network fabric 104 may comprise any suitable network fabric, such as an Ethernet fabric, an Intel Omni-Path Fabric, an Intel True Scale Fabric, an InfiniBand-based fabric (e.g., Infiniband Enhanced Data Rate fabric), a RapidIO fabric, or other suitable network fabric. In other embodiments, network fabric 104 may comprise any other suitable board-to-board or chassis-to-chassis interconnect.

Although not depicted, in various embodiments, processor 106 may include or be coupled to one or more I/O controllers that include logic for communicating data between processor 106 and I/O devices, which may refer to any suitable devices capable of transferring data to and/or receiving data from an electronic system, such as a processor 106. For example, an I/O device may be a fabric controller 122; an FPGA 112; an audio/video (A/V) device controller such as a graphics accelerator or audio controller; a data storage device controller, such as a flash memory device, magnetic storage disk, or optical storage disk controller; a wireless transceiver; a network processor; a network interface controller; or a controller for another input device such as a monitor, printer, mouse, keyboard, or scanner; or other suitable device.

An I/O device may communicate with an I/O controller of the processor 106 using any suitable signaling protocol, such as peripheral component interconnect (PCI), PCI Express (PCIe), Universal Serial Bus (USB), Serial Attached SCSI (SAS), Serial ATA (SATA), Fibre Channel (FC), IEEE 802.3, IEEE 802.11, or other current or future signaling protocol. In various embodiments, I/O devices coupled to the I/O controller may be located off-chip (i.e., not on the same integrated circuit or die as processor 106) or may be integrated on the same integrated circuit or die as the processor 106.

Although not depicted, system 100 may use a battery, renewable energy converter (e.g., solar power or motion-based energy), and/or power supply outlet connector and associated system to receive power, a display to output data provided by one or more processors 106, or a network interface allowing the processors 106 to communicate over a network. In various embodiments, the battery, power supply outlet connector, display, and/or network interface may be communicatively coupled to processors 106.

The components of a node 102 may be coupled together in any suitable manner. For example, a bus may couple any of the components together. A bus may include any known interconnect, such as a multi-drop bus, a mesh interconnect, a ring interconnect, a point-to-point interconnect, a serial interconnect, a parallel bus, a coherent (e.g. cache coherent) bus, a layered protocol architecture, a differential bus, a Gunning transceiver logic (GTL) bus, or other type of interconnect.

Figure 2:
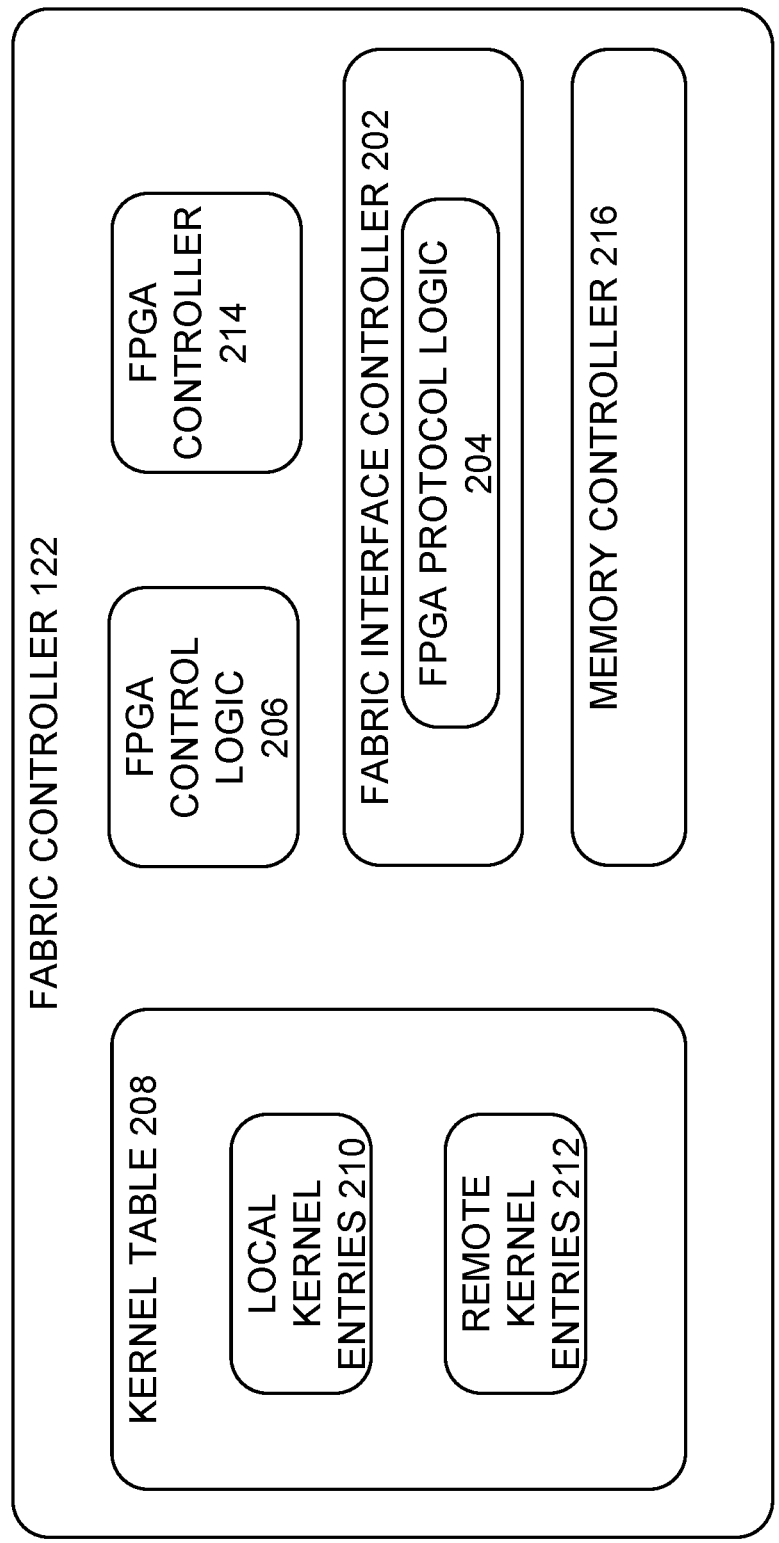
FIG. 2 illustrates an example block diagram of a fabric controller in accordance with certain embodiments.

FIG. 2 illustrates an example block diagram of a fabric controller 122 in accordance with certain embodiments. In the depicted embodiment, fabric controller 122 includes fabric interface controller 202, FPGA control logic 206, kernel table 208, FPGA controller 214, and memory controller 216. In various embodiments, a fabric controller 122 may manage one or more FPGAs resident on the same computing node as (e.g., coupled to the same circuit board as) the fabric controller 122.

Fabric interface controller 202 comprises logic suitable to allow the fabric controller 122 to interface with the network fabric 104 and various components of a computing node 102 (e.g., cores 110). Fabric interface controller 202 may include logic to provide any of the functionality of fabric controller 122 described above. In addition to logic providing such functionality, fabric interface controller 202 includes FPGA protocol logic 204 to handle requests for FPGAs on remote nodes and requests received from remote nodes for local FPGAs. In particular embodiments, FPGA protocol logic 204 may also handle requests received from local components (e.g., cores 110) for local FPGAs.

FPGA protocol logic 204 may be able to process various requests associated with the use of FPGAs (herein referred to as "FPGA requests") and cause results from such requests to be sent back or otherwise made available to the requesting entity. Such requests may include (but are not limited to) an availability check request that allows a requesting entity to check which kernels are currently programmed and/or available to be programmed on a remote FPGA (or whether a particular kernel specified by the requesting entity is programmed on one or more FPGAs), a registration request that allows a requesting entity to request the programming of a particular kernel on a remote FPGA, a run request that allows a requesting entity to have a particular kernel run on a remote FPGA with inputs specified by the requesting entity, and a release request that allows a programmed kernel to be evicted to free up space for a different kernel.

FPGA control logic 206 manages a kernel table 208. FPGA control logic 206 is responsible for controlling access to the kernel table 208, registering kernels, and evicting kernels. For example, FPGA control logic 206 may receive a check availability request through the FPGA protocol logic 204. The check availability request may inquire whether an FPGA managed by the fabric controller 122 is programmed with a particular kernel specified in the request or alternatively may inquire as to which kernels are programmed on the FPGAs managed by the fabric controller. The FPGA control logic 206 may obtain the necessary information to respond to the request and provide this information to FPGA protocol logic 204 for provision to the requesting entity. As another example, FPGA control logic 206 may receive a registration request through the FPGA protocol logic 204 to register a kernel to be programmed on an FPGA managed by the fabric controller 122. In response, the FPGA control logic 206 may determine whether an FPGA managed by the fabric controller 122 may be programmed with the requested kernel. For example, logic 206 may determine whether each FPGA is already programmed with the maximum number of kernels. If an FPGA is available to be programmed with the requested kernel, FPGA control logic 206 may associate an indication of the kernel with the FPGA in an entry of kernel table 208. If all available FPGAs are programmed with the maximum number of kernels when the registration request is received, the logic 206 may determine whether a currently programmed kernel should be evicted. Once a kernel is selected for eviction and that kernel has finished executing (if the kernel is currently being run), the new kernel may be registered and programmed in the evicted kernel's place. The eviction selection process will be described in more detail in connection with FIG. 7.

As described above, a fabric controller 122 may store a kernel table 208 that may be managed by FPGA control logic 206. The kernel table includes indications of kernels that are currently programmed on one or more FPGAs managed by the fabric controller 122. In a particular embodiment, a kernel may include a particular number of entries, where each entry is associated with an FPGA and may store an indication of a kernel programmed on the associated FPGA. Thus, the kernel table 208 may include a number of entries that is equal to a number of kernels that may be programmed onto the FPGAs managed by the fabric controller at a particular instance in time. In particular embodiments, a portion of the entries (i.e., local kernel entries 210) are reserved for kernels registered by requesting entities (e.g., cores 110) located on the same computing node 102 as the fabric controller 122 and the remaining entries (i.e., remote kernel entries) are reserved for kernels registered by requesting entities located on a remote computing node 102.

An entry of kernel table 208 may include any suitable information. For example, an entry may include a unique identifier (ID) of the registered kernel. In various embodiments, each kernel registered includes a unique ID such that no two kernels registered on any of the fabric controllers of the computer system 100 have the same ID. In various embodiments, the fabric controller 122 may assign the IDs for the kernel table entries. In other embodiments, the entity (e.g., a core 110) requesting registration of the kernel may assign the IDs. In other embodiments, any suitable entity of computer system 100 may assign the IDs.

In some embodiments, an entry of kernel table 208 may include an additional identifier of the kernel (e.g., a kernel type identifier). In some embodiments, a list of kernels available to be programmed across the computer system 100 may be made available to each computing node. The list may specify any suitable information associated with each available kernel, such as a kernel type identifier (which could be the additional identifier of the kernel that would be included in an entry of kernel table 208 when the kernel is registered with a fabric controller 122), a textual description of the kernel's functionality, a description of the expected input parameters (including formatting) of the kernel, a description of the output parameters (including formatting) of the kernel, the data structure (e.g., bitstream) that may be programmed on an FPGA to implement an instance of the kernel (or a location in memory of a computing node 102 where the data structure is stored), or other suitable information associated with a kernel.

Thus, in some embodiments, an entry of kernel table 208 may include a first identifier of the registered kernel (i.e., a kernel type identifier) that may be common for any instances of the same kernel registered in one or more fabric controllers 122 of computer system 100 as well as a second identifier that uniquely identifies the registered kernel. Accordingly, if multiple instances of the same kernel are registered (in the same fabric controller 122 or in different fabric controllers 122) in computer system 100, the corresponding kernel table entries may each include a first identifier of the kernel that is the same in both table entries and second identifiers of the kernel that are unique in the table entries. In an alternative embodiment, an entry of kernel table 208 may include a single identifier having a first portion that includes the kernel type identifier and another portion that uniquely identifies the particular instance of the associated kernel.

An entry of kernel table 208 may also include information associated with a data structure (e.g., a bitstream) that is programmed into an FPGA to implement the kernel. In some embodiments, this information may include the data structure itself. In other embodiments, this information may include a location in memory (or other information allowing the identification of) the data structure.

An entry of kernel table 208 may also include an indication (which could be stored in a single bit or in another data structure) indicating whether the registered kernel is currently being executed in the associated FPGA, an indication (which could be stored with a single bit or in another data structure) indicating whether the registered kernel has been executed at least once, an indication of the age of the kernel, an indication of the last time a kernel was executed, an indication of how many times a kernel has been executed, and/or other suitable information associated with the usage of the kernel. Such information may be used by FPGA control logic 206 to determine whether a kernel may be run, whether to evict a kernel, which kernel to evict when all the available entries for a request are full.

In various embodiments, an entry of kernel table may include other suitable information associated with the kernel, such as where input parameters or output parameters for runs of the kernel are to be stored, the size of the expected input parameters or output parameters, or other suitable information.

In particular embodiments, an entry of kernel table 208 may also include a request queue for the associated kernel, such that if a kernel is being executed when a run request for the kernel is received, the parameters of the request may be stored and the kernel may be run when the kernel becomes available. A queue may store any suitable number of requests.

FPGA controller 214 includes logic to communicate with an FPGA 112 in order to cause the FPGA 112 to program a specified kernel. In particular embodiments, FPGA controller 214 may be operable to send the data structure that configures the FPGA to implement a kernel to the FPGA in a format expected by the FPGA. In other embodiments, FPGA controller 214 may send an indication (e.g., an address and length of the data structure in memory) of which kernel to program to the FPGA and the FPGA may retrieve the data structure from memory and program itself based on the data structure. FPGA controller 214 may also include logic to instruct the FPGA 112 to run a kernel with particular input parameters (where the parameters or a location in memory of the parameters may be sent from the fabric controller 122 to the FPGA 112. The FPGA controller may also receive one or more signals from the FPGA, such as the output of a run or an indication that the programming of a particular kernel or a run of a kernel is complete.

In various embodiments, the FPGA controller 214 may be connected to the FPGA in any suitable manner. For example, the FPGA controller 214 may be directly connected to the FPGA via a series of wires. As another example, the FPGA controller 214 may be connected to the FPGA via the same type of interconnect that is used to couple processors of the same computing node together (e.g., UPI). As another example, the FPGA controller 214 may be connected to the FPGA via an I/O controller of a processor.

Memory controller 216 may have any of the characteristics of the memory controller 118 described above and may enable the fabric controller to write to and read from memory of the computing node of the fabric controller 122. In various embodiments, the fabric controller 122 may alternatively utilize a memory controller 118 of a processor to access memory. In particular embodiments, the fabric controller 122 may share an address space with the FPGAs that the fabric controller manages. The fabric controller may store and retrieve input or output parameters for FPGA operations from this address space on behalf of the requesting entity.

Figure 3:
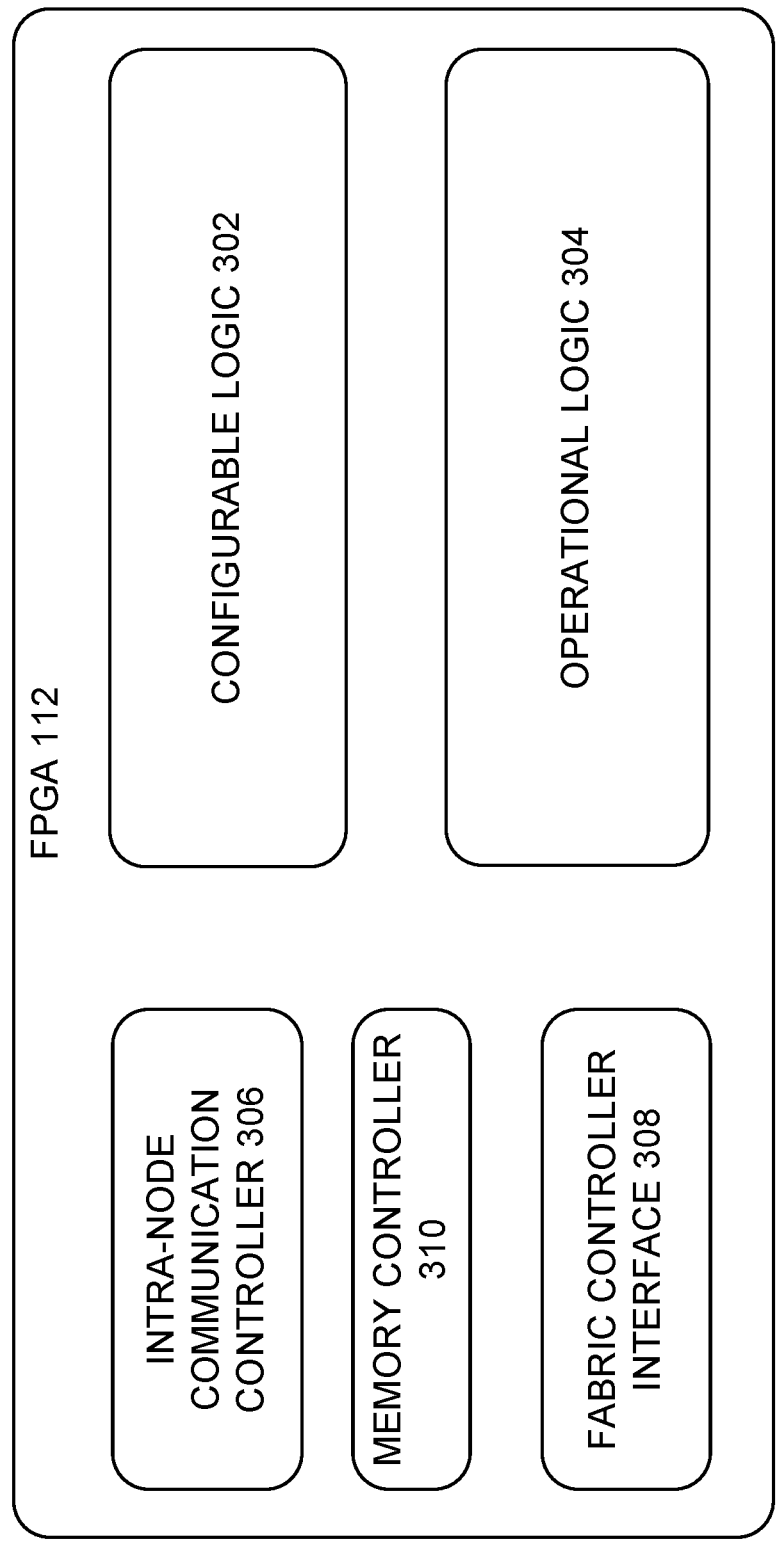
FIG. 3 illustrates an example block diagram of an FPGA in accordance with certain embodiments.

FIG. 3 illustrates an example block diagram of an FPGA 112 in accordance with certain embodiments. In the depicted embodiment, FPGA 112 includes configurable logic 302, operational logic 304, intra-node communication controller 306, fabric controller interface 308, and memory controller 310. Configurable logic 302 includes logic that may be configured to implement one or more kernels. The configurable logic 302 may include any suitable logic, such as any suitable type of logic gates (e.g., AND gates, XOR gates) or combinations of logic gates (e.g., flip flops, look up tables, adders, multipliers, multiplexers, demultiplexers). In some embodiments, the logic is configured (at least in part) through programmable interconnects between logic components of the FPGA.

Operational logic 304 may access a data structure defining a kernel and configure the configurable logic 302 based on the data structure and perform other operations of the FPGA. In some embodiments, control bits are written to memory (e.g., nonvolatile flash memory or SRAM based memory) based on the data structure and the control bits operate to configure the logic (e.g., by activating or deactivating particular interconnects between portions of the configurable logic). The operational logic may include any suitable logic (which may be implemented in configurable logic or fixed logic), such as one or more memory devices including any suitable type of memory (e.g., random access memory (RAM)), one or more transceivers, clocking circuitry, one or more processors located on the FPGA, one or more controllers, or other suitable logic.

Intra-node communication controller 306 may have any of the characteristics of intra-node communication controller 120 described above and may enable FPGA 112 to communicate with other components (e.g., cores 110) of the same computing node 102 via corresponding intra-node communication controllers 120 of those components. Fabric controller interface 308 may have any of the characteristics of fabric interface controller 202 described above and may enable the FPGA to communicate with one or more fabric controllers 122. Memory controller 310 may have any suitable characteristics of memory controller 118 and may enable the FPGA to read data from or write data to memory of the computing node. In various embodiments, memory controller 310 may comprise a direct memory access (DMA) controller.

Figure 4:
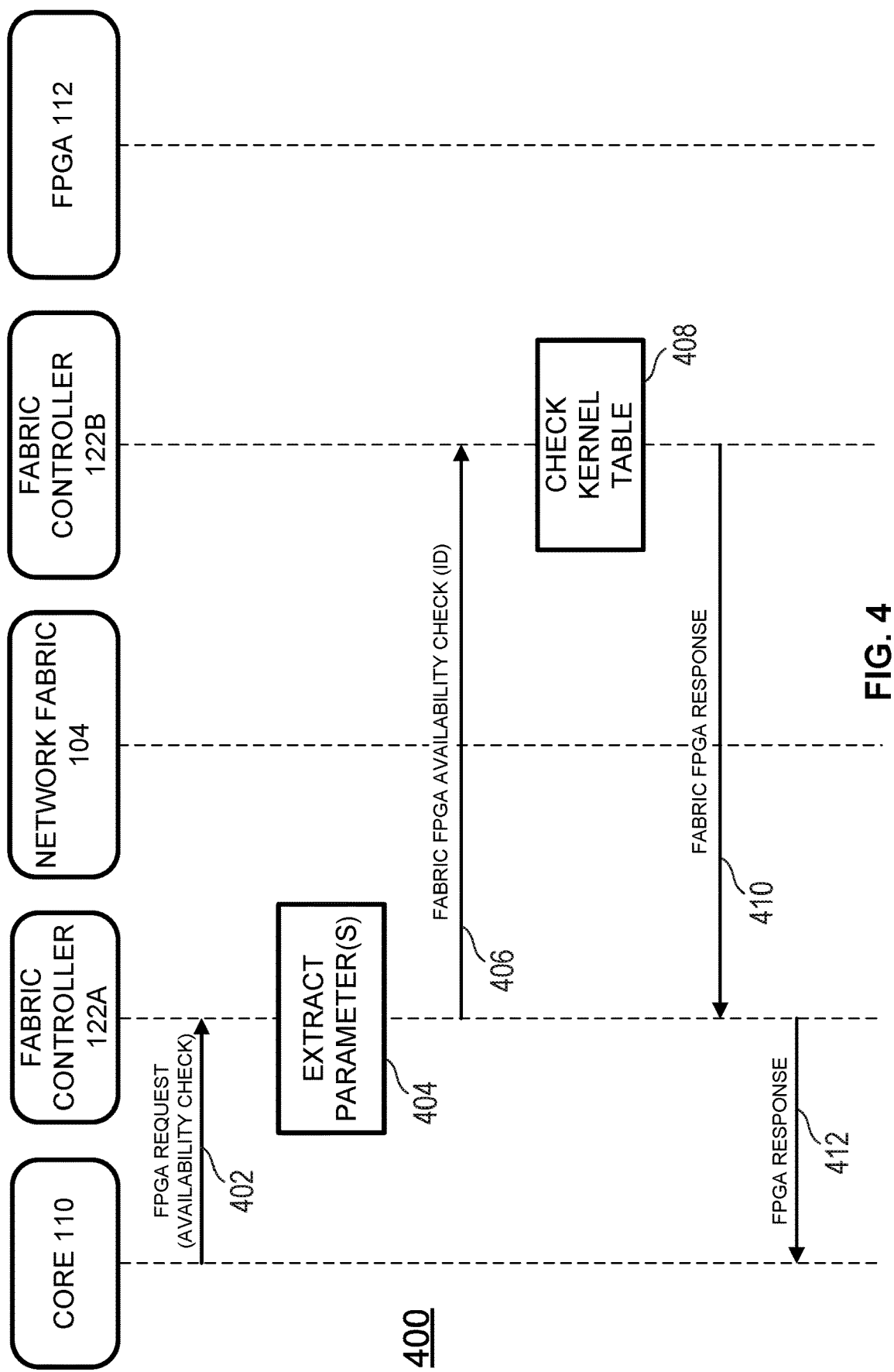
FIG. 4 illustrates an example availability check flow in accordance with certain embodiments.

FIG. 4 illustrates an example availability check flow 400 in accordance with certain embodiments. In the flows described in FIGS. 4-6, a generic command interface is depicted wherein the FPGA requests sent from the core 110 to the fabric controller 122A do not include all of the parameters of the FPGA requests, but may include one or more pointers (e.g., memory addresses of a memory device 108 resident on the same computing node 102 as the core or a memory device 108 resident on the remote computing node) to parameters that are stored in a memory accessible by processor 106. These parameters may be written to local memory or remote memory (via the fabric controller 122A and network fabric 104) prior to the transmission of the FPGA request to the fabric controller 122A. The FPGA request may also include one or more pointers to one or more locations in memory in which results of the FPGA request are to be written. In response to receiving a generic command, the fabric controller 122A may retrieve the parameters of the command from the respective memory device (e.g., 108) and send the parameters along with the FPGA request in a fabric FPGA request over the network fabric 104 to fabric controller 122B. Alternatively, if the parameters are stored at the remote computing node 102

(e.g., these parameters could be transferred to such memory over the fabric in advance of sending the fabric FPGA request), the pointers may be sent over the network fabric 104 to the fabric controller 122B allowing the fabric controller 122B or remote FPGA 112 to retrieve the parameters.

In various embodiments, the generic command interface may allow for descriptions of commands to be placed in firmware, thus allowing customizable instructions that may be rewritten according to processor needs. In such embodiments, when an entity of the processor (e.g., fabric controller 122A) receives a generic command, it can read a description of the command from a memory (e.g., a memory device 108 or other memory of the processor) and process the command in accordance with the description. Such embodiments may allow the use of any number of commands without extending the number of messages supported by a protocol used to send FPGA or other requests (such as memory requests) within a processor 106. Although a flow using a generic command interface is depicted, any suitable flow for generating an FPGA request (e.g., by a core) and passing the FPGA request to fabric controller 122A may be used (e.g., the parameters could be transmitted in the FPGA request from the core to the fabric controller 122A). Although a core 110 is depicted as generating the FPGA requests, any suitable processing element of computing node 102 may be operable to generate an FPGA request.

At 402 of flow 400, core 110 (or other logic of a computing node) generates an availability check FPGA request and sends the request to fabric controller 122A. An availability check FPGA request may be used to request a list of the kernels currently programmed on the FPGAs of a remote computing node, the FPGAs managed by a particular remote fabric controller 122, or a particular remote FPGA. Accordingly, a parameter associated with the FPGA request may specify a remote computing node, a remote fabric controller, and/or a remote FPGA to which the request applies. In some embodiments, an availability check FPGA request may specify a particular kernel type ID and the fabric controllers to which the request is sent may respond with an indication of whether an instance of the particular kernel type is programmed on an FPGA managed by the fabric controller. In various embodiments, the availability check FPGA request may include one or more memory addresses of the parameters associated with the request and one or more memory addresses where the results of the availability check request are to be stored.

At 404, fabric controller 122A extracts parameters for the request (e.g., by retrieving the parameters from memory). At 406, the fabric controller 122A formats the FPGA request including the retrieved parameter(s) (e.g., an identifier of the entity to which the request is directed and a kernel type identifier) according to a message syntax compatible with the network fabric and transmits the resulting fabric FPGA availability check request to the appropriate fabric controller 122B (or to multiple remote fabric controllers if applicable) at 406.

At 408, the fabric controller 122B of the remote computing node checks its kernel table and generates a response with the requested information. For example, the response may include any suitable information from the kernel table described above, such as a list of the kernels currently registered with the fabric controller 122B, whether the kernels are currently being executed, or any other suitable information associated with the kernels (such as identifiers of the kernels). As another example, the response may include an indication of whether an instance of a kernel type specified in the request is registered at the fabric controller 122B along with any suitable information associated with any such registered kernels. As yet another example, the response may include an indication noting that one or more FPGAs managed by the fabric controller 122B are not accessible by the requesting entity. The response is formatted according to the message syntax compatible with the network fabric and sent to fabric controller 122A at 410. The fabric controller 122A may then provide the response to the requesting entity (e.g., core 110) at 412. In some embodiments, this may involve writing the output parameters (e.g., the information about the kernels) to a memory for retrieval by the core 110 at a location that was specified in the FPGA request received at 402. In other embodiments, the output parameters may be provided to the core 110 in any other suitable manner.

The flow described in FIG. 4 is merely representative of operations or communications that may occur in particular embodiments. In other embodiments, additional operations may be performed or additional communications sent among the components of system 100. Various embodiments of the present disclosure contemplate any suitable signaling mechanisms for accomplishing the functions described herein. Some of the communications or other operations illustrated in FIG. 4 may be repeated, combined, modified or deleted where appropriate. Additionally, operations may be performed in any suitable order without departing from the scope of particular embodiments.

Figure 5:
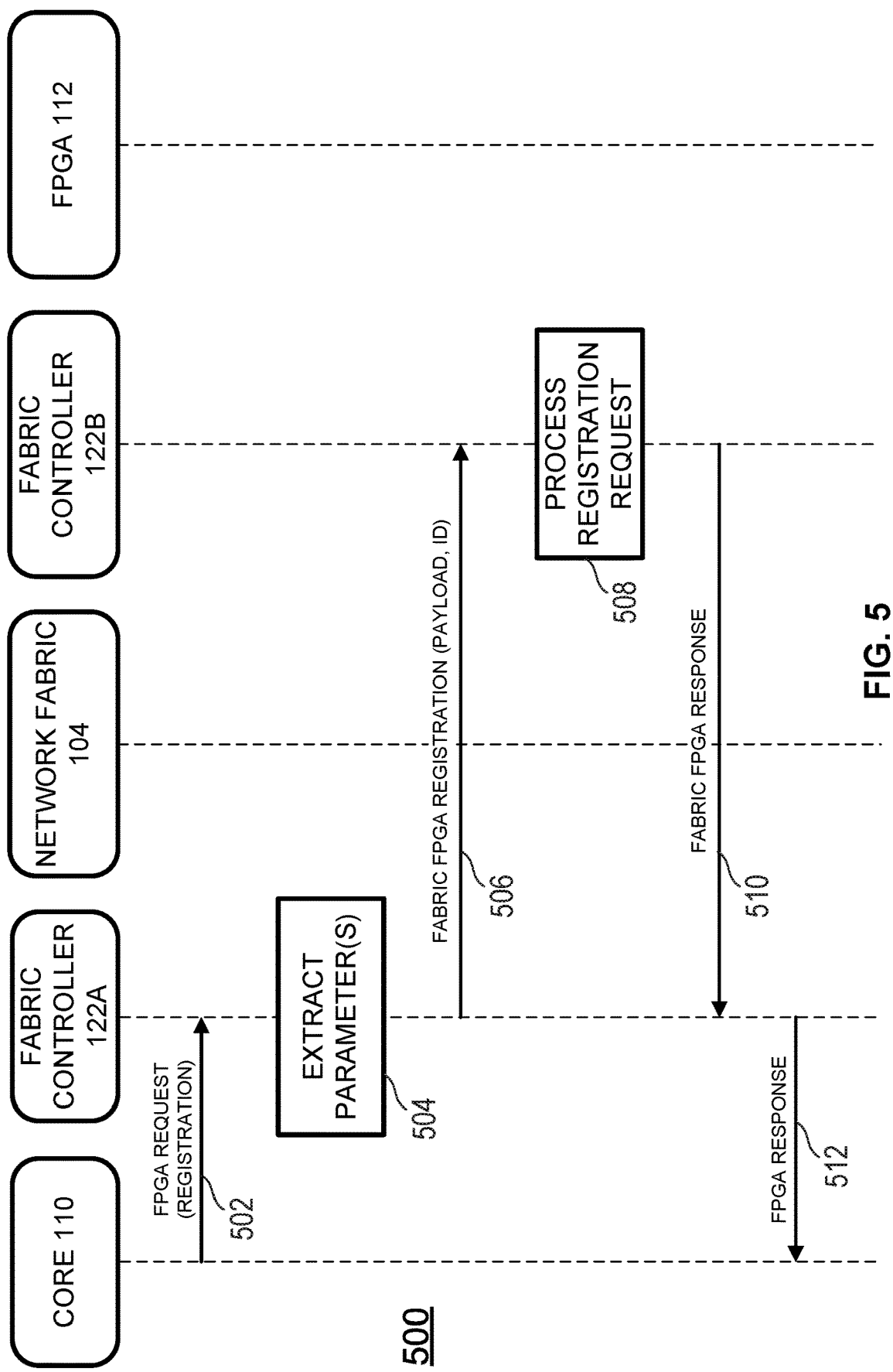
FIG. 5 illustrates an example registration flow in accordance with certain embodiments.

FIG. 5 illustrates an example flow for performing an example registration flow 500 in accordance with certain embodiments. At 502, core 110 (or other logic of a computing node) generates a registration FPGA request and sends the request to fabric controller 122A. A registration FPGA request may be used to request the programming of a particular kernel onto a remote FPGA. A registration FPGA request may be associated with any suitable parameters, such as an identifier of the remote computing node, fabric controller 122B, and/or FPGA 112 upon which the kernel is to be programmed, the data structure (e.g., bitstream) to be programmed to implement the kernel (or an identification or location thereof that allows the remote fabric controller 122B or FPGA to retrieve the data structure), metadata associated with the kernel (e.g., a specification of the input parameters for the kernel and how the parameters should be formatted), one or more identifiers of the kernel (such as a kernel type identifier or a unique identifier for the kernel), and/or other suitable parameters. In various embodiments, the registration FPGA request may include one or more memory addresses of the parameters associated with the request and one or more memory addresses where the results of the registration request are to be stored.

At 504, fabric controller 122A extracts parameters for the request (e.g., by retrieving the parameters from memory). At 506, the fabric controller 122A formats the registration FPGA request including the retrieved parameter(s) (e.g., an identifier of the entity to which the request is directed and a payload comprising other parameters) according to a message syntax compatible with the network fabric and transmits the resulting fabric FPGA registration request to the appropriate fabric controller 122B at 506.

At 508, fabric controller 122B of the remote computing node 102 processes the registration request. In particular embodiments, the fabric controller 122B may verify that the size of the data structure for the kernel does not exceed a supported size. In some embodiments, before registering a kernel, the fabric controller 122B may determine whether the kernel table 208 includes an available entry for the kernel. If the kernel table 208 does not include an available entry, fabric controller 122B may determine whether to evict a kernel from an entry in order to register the incoming kernel.

If the fabric controller 122B decides that the kernel may be registered, a kernel table entry is populated with information associated with the kernel, such as the data structure to be used to implement the kernel, the time the kernel was registered, which FPGA the kernel is to be programmed on, one or more IDs of the kernel, or other suitable information associated with the kernel. In some embodiments, registration may also involve programming the appropriate FPGA with the kernel. In other embodiments (e.g., in the embodiment depicted in FIG. 6), the programming of the kernel may be delayed until a request to run the kernel is received. In any event, a registration request may be viewed as a request to program the kernel on an FPGA.

Fabric controller 122B may also generate a fabric FPGA response and send the response to the fabric controller 122A at 510. The response may indicate whether the registration was successful and any suitable information associated with the registration, such as the unique identifier of the kernel (if the unique identifier was not provided by the requesting entity). The response is formatted according to the message syntax compatible with the network fabric. The fabric controller 122A may then provide the response to the requesting entity (e.g., core 110) at 512. In some embodiments, this may involve writing parameters of the response to a memory for retrieval by the core 110 at a location that was specified in the FPGA request received at 502. In other embodiments, the output parameters may be provided to the core 110 in any other suitable manner.

The flow described in FIG. 5 is merely representative of operations or communications that may occur in particular embodiments. In other embodiments, additional operations may be performed or additional communications sent among the components of system 100. Various embodiments of the present disclosure contemplate any suitable signaling mechanisms for accomplishing the functions described herein. Some of the communications or other operations illustrated in FIG. 5 may be repeated, combined, modified or deleted where appropriate. Additionally, operations may be performed in any suitable order without departing from the scope of particular embodiments.

Figure 6:
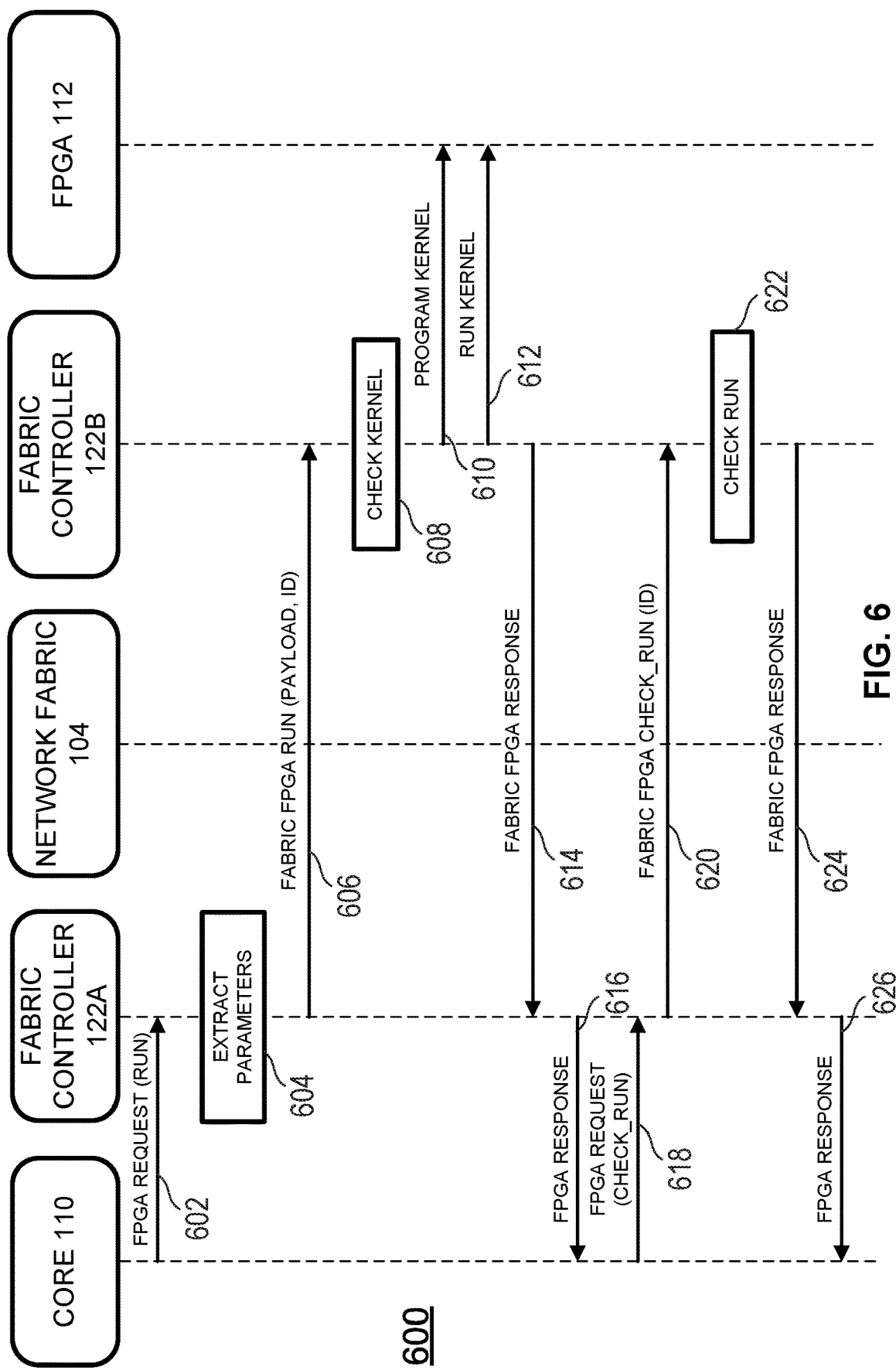
FIG. 6 illustrates an example run flow in accordance with certain embodiments.

FIG. 6 illustrates an example run flow 600 in accordance with certain embodiments. At 602, core 110 (or other logic of a computing node) generates a run FPGA request and sends the request to fabric controller 122A. A run FPGA request may be used to request the execution of a particular kernel on a remote FPGA. A run FPGA request may be associated with any suitable parameters, such as an identifier of the remote computing node, fabric controller 122B, and/or FPGA 112 upon which the kernel is to be run, an identifier of the kernel to be run, input parameters to be provided to the remote FPGA for the run, or other suitable parameters. In various embodiments, the run FPGA request may include one or more memory addresses of the parameters associated with the request and one or more memory addresses where the results of the run request are to be stored.

At 604, fabric controller 122A extracts parameters for the request (e.g., by retrieving the parameters from memory). At 606, the fabric controller 122A formats the registration FPGA request including the retrieved parameter(s) (e.g., an identifier of the entity to which the request is directed and a payload comprising other parameters) according to a message syntax compatible with the network fabric and transmits the resulting fabric FPGA run request to the appropriate fabric controller 122B at 606.

At 608, fabric controller 122B may verify that the kernel identified in the request is registered at fabric controller 122B. The kernel may be registered in either the local kernel entries 210 (i.e., the kernel may have been registered by an entity local to the fabric controller 122B) or the remote kernel entries 212 (i.e., the kernel may have been registered by an entity remote to the fabric controller 122B, where the entity may be the same entity requesting the run or a different entity on the same computing node 102 or a different computing node 102). In various embodiments, a kernel may be registered by a particular requesting entity (which may be local or remote to the fabric controller 122B) and then may be run by other requesting entities of various computing nodes 102. In various embodiments, the fabric controller 122B may also determine whether the input parameters for the run match the expected format (e.g., as specified in the metadata provided in the registration FPGA request), including the expected size.

At 610, the fabric controller instructs the FPGA to program the kernel and sends the data structure for the kernel or an indication of the data structure (e.g., a memory address and size of the data structure) to the FPGA. In various embodiments, the fabric controller may wait to receive a confirmation from the FPGA that the programming of the kernel is complete. In particular embodiments, the request to program the kernel may be sent from the fabric controller to the FPGA without any involvement from a core 110 of the computing node comprising the fabric controller 122B and the FPGA. For example, the request to program the kernel may be sent directly form the fabric controller 122B to the FPGA without any intervening nodes (or may pass through an I/O controller of a processor, but not a core 110).

Fabric controller 122B may generate a transaction identifier for the particular run and may communicate with the FPGA 112 to cause the FPGA 112 to execute the kernel with the specified input parameters at 612. In various embodiments, fabric controller 122B may retrieve the input parameters from memory and pass the input parameters to the FPGA 112. In other embodiments, FPGA 112 may send one or more addresses and/or sizes of the input parameters to the FPGA 112 and the FPGA 112 may retrieve the input parameters from memory. In yet other embodiments, FPGA 112 may be preconfigured to retrieve input parameters from the appropriate memory address(es) when the particular kernel is run (e.g., the memory address(es) may be dedicated to storing input parameters for the particular kernel). Similarly, the fabric controller 122B may pass one or more addresses (or other identifiers) to the FPGA 112 to instruct the FPGA 112 to store the results of the run at the address(es) or the FPGA 112 may be preconfigured to store the results of the run at a particular location in memory. In particular embodiments, the request to run the kernel may be sent from the fabric controller to the FPGA without any involvement from a core 110 of the computing node comprising the fabric controller 122B and the FPGA. For example, the request to run the kernel may be sent directly form the fabric controller 122B to the FPGA without any intervening nodes (or may pass through an I/O controller of a processor, but not a core 110).

Fabric controller 122B may also generate a fabric FPGA response and send the response to the fabric controller 122A at 614. The response may indicate any suitable information associated with the run, such as the transaction identifier assigned for the run. In various embodiments, the response may indicate that the run request has started. In other embodiments, the response may be sent after the run has completed, may indicate that the run is complete, and may include output parameters (or identifications thereof). The response is formatted according to the message syntax compatible with the network fabric. The fabric controller 122A may then provide the response to the requesting entity (e.g., core 110) at 616. In some embodiments, this may involve writing parameters of the response to a memory for retrieval by the core 110 at a location that was specified in the FPGA request received at 602. In other embodiments, the output parameters may be provided to the core 110 in any other suitable manner.

In various embodiments, the requesting entity (e.g., core 110) may also check the status of the run via a check run FPGA request (in alternative embodiments, the fabric controller 122B may periodically check whether the run has completed and then proactively send an indication that the request has completed and the output to the requesting entity). At 618, core 110 (or other logic of a computing node) generates a check run FPGA request and sends the request to fabric controller 122A. A check run FPGA request may be associated with any suitable parameters, such as an identifier of the remote computing node, fabric controller 122B, and/or FPGA 112 upon which the kernel is to be programmed, an identifier of the kernel, the transaction identifier of the run, or other suitable parameters.

At 620, the fabric controller 122A formats the check run FPGA request according to a message syntax compatible with the network fabric and transmits the resulting fabric FPGA check run request to the appropriate fabric controller 122B. At 622, fabric controller 122B checks whether the run is complete. This may be accomplished in any suitable manner. In a particular embodiment, the fabric controller 122B has access to a pre-defined memory address (reserved address space) that holds an integer value that indicates if the FPGA has finished executing the kernel or an error code (if an error occurred during the run). In another embodiment, the FPGA may send a message to the fabric controller 122B when the run is complete or when an error occurred.

Fabric controller 122B may also generate a fabric FPGA response and send the response to the fabric controller 122A at 624. The response may indicate whether the run has been successfully completed. In some embodiments, the response may include an error code if the run did not complete successfully. The response is formatted according to the message syntax compatible with the network fabric. The fabric controller 122A may then provide the response to the requesting entity (e.g., core 110) at 624.

After the kernel has finished, the output of the run may be provided to the requesting entity in any suitable manner. In a particular embodiment, the fabric controller 122B may retrieve the output of the run from the pre-arranged memory address(es). In various embodiments, the metadata associated with the kernel may specify the size of the results allowing the fabric controller 122B to correctly retrieve the results. In other embodiments, the FPGA may send the results to the fabric controller 122B. The results may then be provided to the requesting entity via network fabric 104 and fabric controller 122A (e.g., the results may be written to a memory on the same computing node as the requesting entity or provided to the requesting entity in any other suitable manner).

The flow described in FIG. 6 is merely representative of operations or communications that may occur in particular embodiments. In other embodiments, additional operations may be performed or additional communications sent among the components of system 100. Various embodiments of the present disclosure contemplate any suitable signaling mechanisms for accomplishing the functions described herein. Some of the communications or other operations illustrated in FIG. 6 may be repeated, combined, modified or deleted where appropriate. Additionally, operations may be performed in any suitable order without departing from the scope of particular embodiments.

Figure 7:
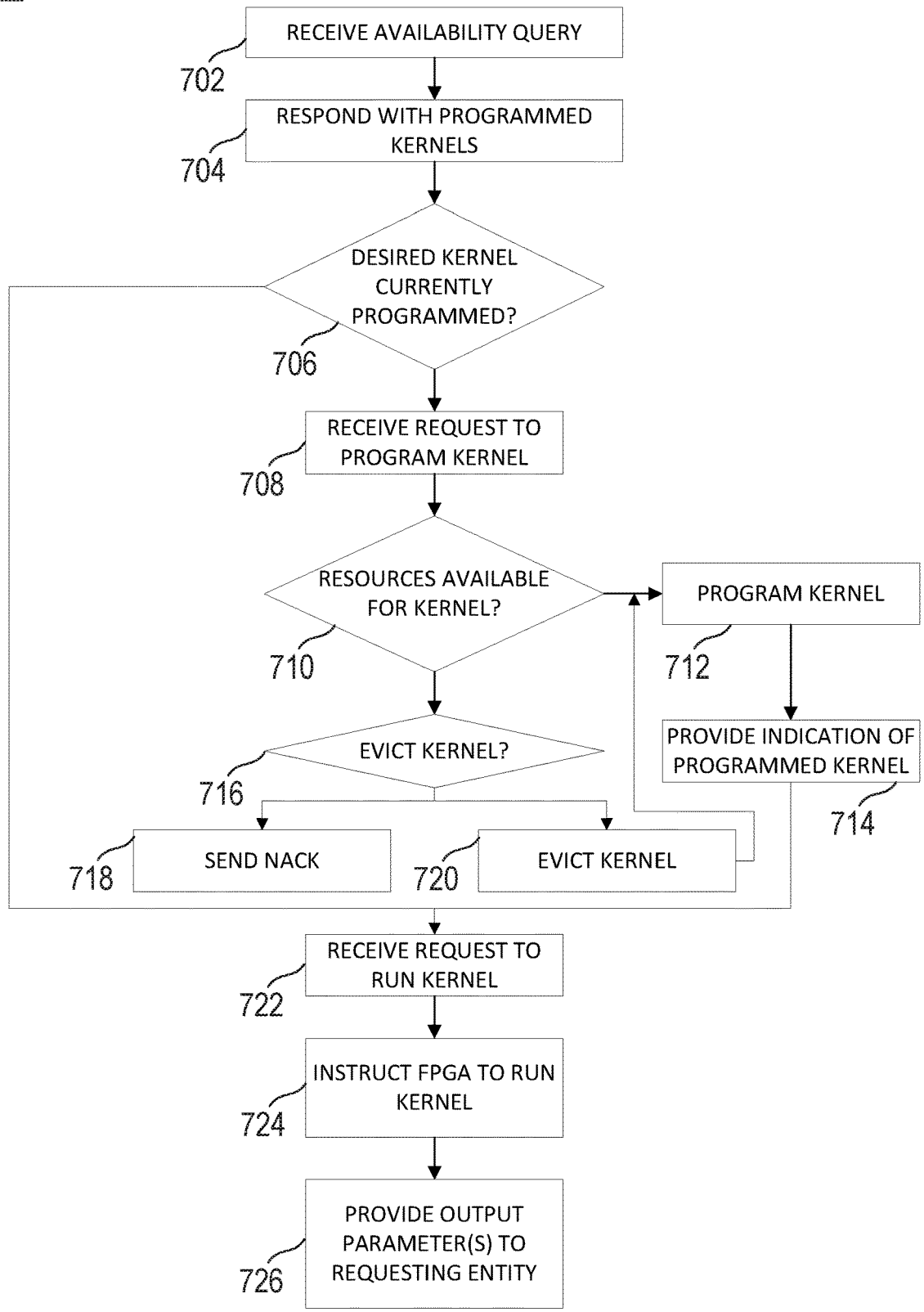
FIG. 7 illustrates an example flow for performing FPGA processing on behalf of a remote computing node in accordance with certain embodiments.

FIG. 7 illustrates an example flow for performing FPGA processing on behalf of a remote computing node 102 in accordance with certain embodiments. In various embodiments, one or more of the operations may be performed by a requesting entity (e.g., core 110), fabric controller 122, FPGA 112, and/or other logic of computer system 100. Although this flow assumes that the requesting entity is located on separate computing node from the fabric FPGA, a similar flow may be followed to process FPGA requests from requesting entities located on the same computing node (such requests may be sent to a fabric controller, but not over network fabric 104).

At 702 an availability query is received at fabric controller 122B. For example, the query may be received from a remote computing node via network fabric 104. The query may request a list of the kernels programmed on one or more FPGAs of a computing node (or managed by a particular fabric controller 122). In alternative embodiments, the query may ask whether a particular type of kernel is programmed on the one or more FPGAs. At 704, a response with an indication of which kernels are programmed (or whether a particular kernel is programmed) is sent to the remote computing node. In alternative embodiments, the query may inquire as to one or more kernels registered with a fabric controller as opposed to programmed on the FPGAs managed by the fabric controller (e.g., if the kernels are programmed after the initial registration, such as when a run request for the kernel is received).

At 706, a requesting entity may determine whether a desired kernel is currently programmed at an FPGA that is usable by the requesting entity. If the desired kernel is not currently programmed, then the requesting entity may submit a request over the network fabric 104 to have the kernel programmed on an FPGA. At 708, the request to program the kernel is received (e.g., by a fabric controller 122B). At 710, it is determined whether resources are available for the kernel. For example, a fabric controller 122B may determine whether any of the FPGAs managed by the fabric controller may be programmed with the kernel. If the FPGAs aren't able to program an additional kernel, a decision on whether to evict a kernel currently programmed in one of the FPGAs is made at 716. Any suitable criteria may be used to determine whether a kernel should be evicted. As various examples, if a kernel programmed on an FPGA has not yet been executed, is currently being executed, was requested by a particular requesting entity (e.g., a core that is on the same computing node as the fabric controller 122B), or is heavily utilized (e.g., using a measurement of how many times the kernel has been run over a particular period of time), the fabric controller may determine that the kernel should not be evicted. If a determination is made that no kernel should be evicted, a negative acknowledgment is sent to the requesting entity at 718 and the requested kernel is not programmed. If a determination is made to evict a kernel, a kernel is selected and then evicted at 720. The kernel to be evicted may be determined in any suitable manner. In one embodiment, the fabric controller 122B determines which kernels reserved for remote computing nodes have been executed at least once and are not currently being executed in the relevant FPGA. Of this group, the fabric controller 122B may select the least recently executed kernel for eviction. In other embodiments, any suitable criteria may be used to determine which kernel to evict, such as how often the kernel has been run, which requesting entity requested the kernel, the last time the kernel was run, when the kernel was programmed or registered, or other suitable criteria.

At 712 (either after a kernel is evicted at 720 or after a determination that resources are available for the kernel is made at 710), the kernel is programmed on an FPGA (or registered by the fabric controller 122B and then programmed later). At 714, an indication of the programmed kernel is provided. For example, an acknowledgment that the kernel was programmed along with any suitable information to be used to run the kernel (e.g., an ID associated with the programmed kernel) is provided to the requesting entity.

At 722, a request to run the kernel is received (e.g., over the network fabric at a fabric controller 122B). At 724, the FPGA upon which the kernel is programmed is requested to run the kernel. The fabric controller 122B may provide the input parameters for the run in the request sent to the FPGA or the FPGA may retrieve the input parameters from memory. At 726, the output of the run is provided to the requesting entity over the network fabric.

The flow described in FIG. 7 is merely representative of operations or communications that may occur in particular embodiments. In other embodiments, additional operations may be performed or additional communications sent among the components of system 100. Various embodiments of the present disclosure contemplate any suitable signaling mechanisms for accomplishing the functions described herein. Some of the communications or other operations illustrated in FIG. 7 may be repeated, combined, modified or deleted where appropriate. Additionally, operations may be performed in any suitable order without departing from the scope of particular embodiments.

A design may go through various stages, from creation to simulation to fabrication. Data representing a design may represent the design in a number of manners. First, as is useful in simulations, the hardware may be represented using a hardware description language (HDL) or another functional description language. Additionally, a circuit level model with logic and/or transistor gates may be produced at some stages of the design process. Furthermore, most designs, at some stage, reach a level of data representing the physical placement of various devices in the hardware model. In the case where conventional semiconductor fabrication techniques are used, the data representing the hardware model may be the data specifying the presence or absence of various features on different mask layers for masks used to produce the integrated circuit. In some implementations, such data may be stored in a database file format such as Graphic Data System II (GDS II), Open Artwork System Interchange Standard (OASIS), or similar format.

In some implementations, software based hardware models, and HDL and other functional description language objects can include register transfer language (RTL) files, among other examples. Such objects can be machine-parsable such that a design tool can accept the HDL object (or model), parse the HDL object for attributes of the described hardware, and determine a physical circuit and/or on-chip layout from the object. The output of the design tool can be used to manufacture the physical device. For instance, a design tool can determine configurations of various hardware and/or firmware elements from the HDL object, such as bus widths, registers (including sizes and types), memory blocks, physical link paths, fabric topologies, among other attributes that would be implemented in order to realize the system modeled in the HDL object. Design tools can include tools for determining the topology and fabric configurations of system on chip (SoC) and other hardware device. In some instances, the HDL object can be used as the basis for developing models and design files that can be used by manufacturing equipment to manufacture the described hardware. Indeed, an HDL object itself can be provided as an input to manufacturing system software to cause the described hardware.

In any representation of the design, the data may be stored in any form of a machine readable medium. A memory or a magnetic or optical storage such as a disc may be the machine readable medium to store information transmitted via optical or electrical wave modulated or otherwise generated to transmit such information. When an electrical carrier wave indicating or carrying the code or design is transmitted, to the extent that copying, buffering, or re-transmission of the electrical signal is performed, a new copy is made. Thus, a communication provider or a network provider may store on a tangible, machine-readable medium, at least temporarily, an article, such as information encoded into a carrier wave, embodying techniques of embodiments of the present disclosure.

A module as used herein refers to any combination of hardware, software, and/or firmware. As an example, a module includes hardware, such as a micro-controller, associated with a non-transitory medium to store code adapted to be executed by the micro-controller. Therefore, reference to a module, in one embodiment, refers to the hardware, which is specifically configured to recognize and/or execute the code to be held on a non-transitory medium. Furthermore, in another embodiment, use of a module refers to the non-transitory medium including the code, which is specifically adapted to be executed by the microcontroller to perform predetermined operations. And as can be inferred, in yet another embodiment, the term module (in this example) may refer to the combination of the microcontroller and the non-transitory medium. Often module boundaries that are illustrated as separate commonly vary and potentially overlap. For example, a first and a second module may share hardware, software, firmware, or a combination thereof, while potentially retaining some independent hardware, software, or firmware. In one embodiment, use of the term logic includes hardware, such as transistors, registers, or other hardware, such as programmable logic devices.

Logic may be used to implement any of the functionality of the various components such as network fabric 104, processor 106, memory device 108, core 110, FPGA 112, memory controller 118, intra-node communication controller 120, fabric controller 122, fabric interface controller 202, FPGA control logic 206, kernel table 208, FPGA controller 214, memory controller 216, configurable logic 302, operational logic 304, intra-node communication controller 306, fabric interface controller 308, memory controller 320, or other entity described herein. "Logic" may refer to hardware, firmware, software and/or combinations of each to perform one or more functions. In various embodiments, logic may include a microprocessor or other processing element operable to execute software instructions, discrete logic such as an application specific integrated circuit (ASIC), a programmed logic device such as a field programmable gate array (FPGA), a memory device containing instructions, combinations of logic devices (e.g., as would be found on a printed circuit board), or other suitable hardware and/or software. Logic may include one or more gates or other circuit components. In some embodiments, logic may also be fully embodied as software. Software may be embodied as a software package, code, instructions, instruction sets and/or data recorded on non-transitory computer readable storage medium. Firmware may be embodied as code, instructions or instruction sets and/or data that are hard-coded (e.g., nonvolatile) in memory devices.

Use of the phrase 'to' or 'configured to,' in one embodiment, refers to arranging, putting together, manufacturing, offering to sell, importing and/or designing an apparatus, hardware, logic, or element to perform a designated or determined task. In this example, an apparatus or element thereof that is not operating is still 'configured to' perform a designated task if it is designed, coupled, and/or interconnected to perform said designated task. As a purely illustrative example, a logic gate may provide a 0 or a 1 during operation. But a logic gate 'configured to' provide an enable signal to a clock does not include every potential logic gate that may provide a 1 or 0. Instead, the logic gate is one coupled in some manner that during operation the 1 or 0 output is to enable the clock. Note once again that use of the term 'configured to' does not require operation, but instead focus on the latent state of an apparatus, hardware, and/or element, where in the latent state the apparatus, hardware, and/or element is designed to perform a particular task when the apparatus, hardware, and/or element is operating.

Furthermore, use of the phrases 'capable of/to,' and or 'operable to,' in one embodiment, refers to some apparatus, logic, hardware, and/or element designed in such a way to enable use of the apparatus, logic, hardware, and/or element in a specified manner. Note as above that use of to, capable to, or operable to, in one embodiment, refers to the latent state of an apparatus, logic, hardware, and/or element, where the apparatus, logic, hardware, and/or element is not operating but is designed in such a manner to enable use of an apparatus in a specified manner.

A value, as used herein, includes any known representation of a number, a state, a logical state, or a binary logical state. Often, the use of logic levels, logic values, or logical values is also referred to as 1's and 0's, which simply represents binary logic states. For example, a 1 refers to a high logic level and 0 refers to a low logic level. In one embodiment, a storage cell, such as a transistor or flash cell, may be capable of holding a single logical value or multiple logical values. However, other representations of values in computer systems have been used. For example the decimal number ten may also be represented as a binary value of 1010 and a hexadecimal letter A. Therefore, a value includes any representation of information capable of being held in a computer system.

Moreover, states may be represented by values or portions of values. As an example, a first value, such as a logical one, may represent a default or initial state, while a second value, such as a logical zero, may represent a non-default state. In addition, the terms reset and set, in one embodiment, refer to a default and an updated value or state, respectively. For example, a default value potentially includes a high logical value, i.e. reset, while an updated value potentially includes a low logical value, i.e. set. Note that any combination of values may be utilized to represent any number of states.

The embodiments of methods, hardware, software, firmware or code set forth above may be implemented via instructions or code stored on a machine-accessible, machine readable, computer accessible, or computer readable medium which are executable by a processing element. A non-transitory machine-accessible/readable medium includes any mechanism that provides (i.e., stores and/or transmits) information in a form readable by a machine, such as a computer or electronic system. For example, a non-transitory machine-accessible medium includes random-access memory (RAM), such as static RAM (SRAM) or dynamic RAM (DRAM); ROM; magnetic or optical storage medium; flash memory devices; electrical storage devices; optical storage devices; acoustical storage devices; other form of storage devices for holding information received from transitory (propagated) signals (e.g., carrier waves, infrared signals, digital signals); etc., which are to be distinguished from the non-transitory mediums that may receive information there from.

Instructions used to program logic to perform embodiments of the disclosure may be stored within a memory in the system, such as DRAM, cache, flash memory, or other storage. Furthermore, the instructions can be distributed via a network or by way of other computer readable media. Thus a machine-readable medium may include any mechanism for storing or transmitting information in a form readable by a machine (e.g., a computer), but is not limited to, floppy diskettes, optical disks, Compact Disc, Read-Only Memory (CD-ROMs), and magneto-optical disks, Read-Only Memory (ROMs), Random Access Memory (RAM), Erasable Programmable Read-Only Memory (EPROM), Electrically Erasable Programmable Read-Only Memory (EEPROM), magnetic or optical cards, flash memory, or a tangible, machine-readable storage used in the transmission of information over the Internet via electrical, optical, acoustical or other forms of propagated signals (e.g., carrier waves, infrared signals, digital signals, etc.). Accordingly, the computer-readable medium includes any type of tangible machine-readable medium suitable for storing or transmitting electronic instructions or information in a form readable by a machine (e.g., a computer).

In at least one embodiment, an apparatus comprises a fabric controller of a first computing node, the fabric controller to receive, from a second computing node via a network fabric that couples the first computing node to the second computing node, a request to execute a kernel on a field-programmable gate array (FPGA) of the first computing node; instruct the FPGA to execute the kernel; and send a result of the execution of the kernel to the second computing node via the network fabric.

In an embodiment, the fabric controller is to instruct the FPGA to execute the kernel by sending message from the fabric controller to the FPGA, wherein the message does not pass through a processing core of the first computing node. In an embodiment, the fabric controller is further to initiate the programming of a data structure on the FPGA in response to a request from the second computing node, the data structure comprising information to configure logic of the FPGA to enable the FPGA to implement the kernel. In an embodiment, the fabric controller initiates the programming of the data structure in response to receiving the data structure from the second computing node. In an embodiment, the fabric controller initiates the programming of the data structure in response to receiving the request to execute the kernel from the second computing node. In an embodiment, the data structure is sent from the fabric controller to the FPGA without passing through a processing core of the first computing node. In an embodiment, the fabric controller is further to direct the FPGA to store the result of the execution of the kernel in a memory of the first computing node. In an embodiment, the fabric controller is further to store a plurality of kernel entries, wherein a kernel entry identifies a kernel programmed on an FPGA managed by the fabric controller. In an embodiment, a first set of the kernel entries are reserved for the first computing node and a second set of the kernel entries are reserved for one or more other computing nodes, the one or more other computing nodes comprising the second computing node. In an embodiment, the fabric controller is further to evict a kernel from the FPGA in response to a request to program the kernel. In an embodiment, the kernel that is evicted is selected based on a determination that the kernel is not being used. In an embodiment, the kernel that is evicted is selected based on a determination of the time elapsed since the kernel was last executed. In an embodiment, the kernel that is evicted is selected based on a determination that the kernel has been executed at least once. In an embodiment, the fabric controller is to instruct the FPGA to execute the kernel in response to a determination that the FPGA is not currently executing the kernel.

In an embodiment, method comprises receiving, at a fabric controller of a first computing node from a second computing node via a network fabric that couples the first computing node to the second computing node, a request to execute a kernel on a field-programmable gate array (FPGA) of the first computing node; instructing the FPGA to execute the kernel; and sending a result of the execution of the kernel to the second computing node via the network fabric.

In an embodiment, instructing the FPGA to execute the kernel comprises sending a message from the fabric controller to the FPGA, wherein the message does not pass through a processing core of the first computing node. In an embodiment, the method further comprises initiating, by the fabric controller, the programming of a data structure on the FPGA in response to a request from the second computing node, the data structure comprising information to configure logic of the FPGA to enable the FPGA to implement the kernel. In an embodiment, the fabric controller initiates the programming of the data structure in response to receiving the data structure from the second computing node. In an embodiment, the fabric controller initiates the programming of the data structure in response to receiving the request to execute the kernel from the second computing node. In an embodiment, the data structure is sent from the fabric controller to the FPGA without passing through a processing core of the first computing node. In an embodiment, the method further comprises directing the FPGA to store the result of the execution of the kernel in a memory of the first computing node. In an embodiment, the method further comprises storing, by the fabric controller, a plurality of kernel entries, wherein a kernel entry identifies a kernel programmed on an FPGA managed by the fabric controller. In an embodiment, a first set of the kernel entries are reserved for the first computing node and a second set of the kernel entries are reserved for one or more other computing nodes, the one or more other computing nodes comprising the second computing node. In an embodiment, the method further comprises evicting a kernel from the FPGA in response to a request to program the kernel. In an embodiment, the kernel that is evicted is selected based on a determination that the kernel is not being used. In an embodiment, the kernel that is evicted is selected based on a determination of the time elapsed since the kernel was last executed.

In at least one embodiment, a system comprises a first computing node comprising a processor core to generate a request to execute a kernel; and a first fabric controller to receive the request to execute the kernel from the processor core; and a second computing node. The second computing node comprises a field programmable gate array (FPGA); and a second fabric controller. The second fabric controller is to receive the request to execute the kernel from the first fabric controller over a network fabric coupling the second computing node to the first computing node; instruct the FPGA to execute the kernel; and send a result of the execution of the kernel to the first computing node via the network fabric.

In an embodiment, instructing the FPGA to execute the kernel comprises sending a message from the second fabric controller to the FPGA, wherein the message does not pass through a processing core of the second computing node. In an embodiment, the system further comprises one or more of a battery communicatively coupled to the first computing node; or a display communicatively coupled to the first computing node.

In at least one embodiment, an apparatus comprises a field programmable gate array (FPGA) of a first computing node, the FPGA to couple to a fabric controller of the first computing node, the fabric controller to couple the first computing node to a second computing node. The FPGA is to in response to a request from the fabric controller, program configurable logic of the FPGA to implement a kernel specified in the request, wherein the request is to originate from the second computing node; and in response to a second request from the fabric controller, execute the kernel on behalf of the second computing node and provide an output to the fabric controller.

In an embodiment, communications between the FPGA and the fabric controller do not pass through a processing core of the first computing node. In an embodiment, the request from the fabric controller comprises a data structure to specify how the configurable logic of the FPGA is to be programmed to implement the kernel. In an embodiment, the FPGA is further to send a message to the fabric controller indicating the number of kernels the FPGA may implement simultaneously. In an embodiment, the FPGA is to provide the output to the fabric controller by storing the output at a memory location specified by the fabric controller.

In at least one embodiment, an apparatus comprises means to receive, from a second computing node via a network fabric that couples the first computing node to the second computing node, a request to execute a kernel on a field-programmable gate array (FPGA) of the first computing node; means to instruct the FPGA to execute the kernel; and means to send a result of the execution of the kernel to the second computing node via the network fabric.

In an embodiment, instructing the FPGA to execute the kernel comprise sending a message from the fabric controller to the FPGA, wherein the message does not pass through a processing core of the first computing node. In an embodiment, the apparatus further comprises means to initiate the programming of a data structure on the FPGA in response to a request from the second computing node, the data structure comprising information to configure logic of the FPGA to enable the FPGA to implement the kernel. In an embodiment, the programming of the data structure is initiated in response to receiving the data structure from the second computing node. In an embodiment, the programming of the data structure is initiated in response to receiving the request to execute the kernel from the second computing node. In an embodiment, the data structure is sent to the FPGA without passing through a processing core of the first computing node. In an embodiment, the apparatus further comprising means to direct the FPGA to store the result of the execution of the kernel in a memory of the first computing node. In an embodiment, the apparatus further comprises means to store a plurality of kernel entries, wherein a kernel entry identifies a kernel programmed on an FPGA managed by the fabric controller. In an embodiment, a first set of the kernel entries are reserved for the first computing node and a second set of the kernel entries are reserved for one or more other computing nodes, the one or more other computing nodes comprising the second computing node. In an embodiment, the apparatus further comprises means to evict a kernel from the FPGA in response to a request to program the kernel. In an embodiment, the kernel that is evicted is selected based on a determination that the kernel is not being used. In an embodiment, the kernel that is evicted is selected based on a determination of the time elapsed since the kernel was last executed. In an embodiment, the kernel that is evicted is selected based on a determination that the kernel has been executed at least once. In an embodiment, the apparatus further comprises means to instruct the FPGA to execute the kernel in response to a determination that the FPGA is not currently executing the kernel.

In at least one embodiment, a system comprises means (e.g., a fabric controller 122 or logic thereof, such as a fabric interface controller 202 or other receiving logic) for receiving, at a fabric controller of a first computing node from a second computing node via a network fabric that couples the first computing node to the second computing node, a request to execute a kernel on a field-programmable gate array (FPGA) of the first computing node; means (e.g., any logic of a computing node 102, such as a fabric controller 122 or logic thereof, such as an FPGA controller 214 or other logic) for instructing the FPGA to execute the kernel; and means (e.g., any logic of a computing node 102, such as a fabric controller or logic thereof, such as a fabric interface controller 202 or other suitable transmission logic) for sending a result of the execution of the kernel to the second computing node via the network fabric.

In an embodiment, instructing the FPGA to execute the kernel comprises sending a message from the fabric controller to the FPGA, wherein the message does not pass through a processing core of the first computing node. In an embodiment, the system further comprises means (e.g., any logic of a computing node 102, such as a fabric controller 122 or logic thereof, such as an FPGA controller 214 or other logic) for initiating the programming of a data structure on the FPGA in response to a request from the second computing node, the data structure comprising information to configure logic of the FPGA to enable the FPGA to implement the kernel. In an embodiment, the system further comprises means (e.g., any logic of a computing node 102, such as an FPGA 112 or logic thereof, such as fabric controller interface 308 or other logic) to send a message to the fabric controller indicating the number of kernels the FPGA may implement simultaneously. In an embodiment, the system further comprises means (e.g., any logic of a computing node 102, such as an FPGA 112 or logic thereof, such as memory controller 310 or other logic) to provide the output to the fabric controller by storing the output at a memory location specified by the fabric controller.

Reference throughout this specification to "one embodiment" or "an embodiment" means that a particular feature, structure, or characteristic described in connection with the embodiment is included in at least one embodiment of the present disclosure. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

In the foregoing specification, a detailed description has been given with reference to specific exemplary embodiments. It will, however, be evident that various modifications and changes may be made thereto without departing from the broader spirit and scope of the disclosure as set forth in the appended claims. The specification and drawings are, accordingly, to be regarded in an illustrative sense rather than a restrictive sense. Furthermore, the foregoing use of embodiment and other exemplarily language does not necessarily refer to the same embodiment or the same example, but may refer to different and distinct embodiments, as well as potentially the same embodiment.

The invention claimed is:

1. An apparatus comprising:
a hardware fabric controller of a first computing node, the fabric controller to:
receive, from a second computing node via a network fabric that couples the first computing node to the second computing node, a request to execute a kernel on a field-programmable gate array (FPGA) of the first computing node;
instruct the FPGA to execute the kernel; and
send a result of the execution of the kernel to the second computing node via the network fabric.

2. The apparatus of claim 1, wherein the fabric controller is to instruct the FPGA to execute the kernel by sending a message from the fabric controller to the FPGA, wherein the message does not pass through a processing core of the first computing node.

3. The apparatus of claim 1, wherein the fabric controller is further to initiate programming of a data structure on the FPGA in response to a request from the second computing node, the data structure comprising information to configure logic of the FPGA to enable the FPGA to implement the kernel.

4. The apparatus of claim 3, wherein the fabric controller initiates the programming of the data structure in response to receiving the data structure from the second computing node.

5. The apparatus of claim 3, wherein the fabric controller initiates the programming of the data structure in response to receiving the request to execute the kernel from the second computing node.

6. The apparatus of claim 3, wherein the data structure is sent from the fabric controller to the FPGA without passing through a processing core of the first computing node.

7. The apparatus of claim 1, wherein the fabric controller is further to direct the FPGA to store the result of the execution of the kernel in a memory of the first computing node.

8. The apparatus of claim 1, wherein the fabric controller is further to store a plurality of kernel entries, wherein a kernel entry identifies a kernel programmed on an FPGA managed by the fabric controller.

9. The apparatus of claim 8, wherein a first set of the kernel entries is reserved for the first computing node and a second set of the kernel entries is reserved for one or more other computing nodes, the one or more other computing nodes comprising the second computing node.

10. The apparatus of claim 1, wherein the fabric controller is further to evict a kernel from the FPGA in response to a request to program the kernel.

11. The apparatus of claim 10, wherein the kernel that is evicted is selected based on a determination that the kernel is not being used.

12. The apparatus of claim 10, wherein the kernel that is evicted is selected based on a determination of time elapsed since the kernel was last executed.

13. The apparatus of claim 10, wherein the kernel that is evicted is selected based on a determination that the kernel has been executed at least once.

14. The apparatus of claim 1, wherein the fabric controller is to instruct the FPGA to execute the kernel in response to a determination that the FPGA is not currently executing the kernel.

15. A method comprising:
receiving, at a hardware fabric controller of a first computing node from a second computing node via a network fabric that couples the first computing node to the second computing node, a request to execute a kernel on a field-programmable gate array (FPGA) of the first computing node;
instructing the FPGA to execute the kernel; and
sending a result of the execution of the kernel to the second computing node via the network fabric.

16. The method of claim 15, wherein instructing the FPGA to execute the kernel comprises sending a message from the fabric controller to the FPGA, wherein the message does not pass through a processing core of the first computing node.

17. The method of claim 15, further comprising initiating programming of a data structure on the FPGA in response to a request from the second computing node, the data structure comprising information to configure logic of the FPGA to enable the FPGA to implement the kernel.

18. A system comprising:
a first computing node comprising:
a processor core to generate a request to execute a kernel; and
a first fabric controller hardware to receive the request to execute the kernel from the processor core; and
a second computing node comprising:
a field programmable gate array (FPGA); and
a second fabric controller to:
receive the request to execute the kernel from the first fabric controller hardware over a network fabric coupling the second computing node to the first computing node;
instruct the FPGA to execute the kernel; and
send a result of the execution of the kernel to the first computing node via the network fabric.

19. The system of claim 18, wherein instructing the FPGA to execute the kernel comprises sending a message from the second fabric controller to the FPGA, wherein the message does not pass through a processing core of the second computing node.

20. The system of claim 18, further comprising one or more of:
a battery communicatively coupled to the first computing node; or
a display communicatively coupled to the first computing node.

* * * * *